United States Patent [19]

Binder et al.

[11] Patent Number: 5,759,750
[45] Date of Patent: Jun. 2, 1998

[54] RADIATION-SENSITIVE MIXTURE

[75] Inventors: Horst Binder, Lampertheim; Reinhold Schwalm, Wachenheim; Dirk Funhoff, Heidelberg, all of Germany

[73] Assignee: BASF Aktiengesellschaft, Ludwigshafen, Germany

[21] Appl. No.: 839,938

[22] Filed: Apr. 18, 1997

Related U.S. Application Data

[63] Continuation of Ser. No. 586,573, Jan. 16, 1996, abandoned, which is a continuation of Ser. No. 319,089, Oct. 16, 1994, abandoned, which is a continuation of Ser. No. 10,317, Jan. 28, 1993, abandoned.

[30] Foreign Application Priority Data

Jan. 31, 1992 [DE] Germany ............... 42 02 845.0

[51] Int. Cl.$^6$ ............... G03F 7/30; G03F 7/40; G03F 7/004
[52] U.S. Cl. ............... 430/326; 430/270.1; 430/330; 430/909; 430/914; 430/905; 430/921; 522/31; 522/59; 522/150; 522/154
[58] Field of Search ............... 430/270.1, 326, 430/330, 909, 914, 921, 905; 522/31, 59, 150, 154

[56] References Cited

U.S. PATENT DOCUMENTS

| | | | |
|---|---|---|---|
| 3,779,778 | 12/1973 | Smith et al. | 96/115 |
| 3,915,706 | 10/1975 | Limburg et al. | 96/27 |
| 4,491,628 | 1/1985 | Ito et al. | 430/176 |
| 4,678,737 | 7/1987 | Schneller et al. | 430/270 |
| 4,810,613 | 3/1989 | Osuch et al. | 430/192 |
| 4,883,740 | 11/1989 | Schwalm et al. | 430/270 |
| 4,904,563 | 2/1990 | Aoai et al. | 430/270 |
| 5,069,997 | 12/1991 | Schwalm et al. | 430/270 |
| 5,110,709 | 5/1992 | Aoai et al. | 430/326 |
| 5,118,582 | 6/1992 | Ueno et al. | 430/921 |
| 5,468,589 | 11/1995 | Urano et al. | 430/170 |

FOREIGN PATENT DOCUMENTS

| | | |
|---|---|---|
| 291 994 | 11/1988 | European Pat. Off. . |
| 0 388 813 | 9/1990 | European Pat. Off. . |
| 440 374 | 8/1991 | European Pat. Off. . |
| 0447868 | 9/1991 | European Pat. Off. . |
| 520 642 | 12/1992 | European Pat. Off. . |
| 40 07 924 | 9/1991 | Germany . |
| 3-282550 | 12/1991 | Japan ............... 430/270 |

OTHER PUBLICATIONS

Crivello, "Applications of Photoinitiates Cationic Polymerization Toward the Development of New Photoresists", *Org. Coatings & Appl. Polym. Sc.*, vol. 48, pp. 65–69, 1985.

Ito, "Solid–State Thermolysis of . . . ", *J. Polym. Sci.*, Part A, Polym. Chem. Ed., vol. 24, pp. 2971–2980, 1986.

Schlegel et al., "Highly Sensitive Positive Deep UV . . . ", *Microelectron. Eng.*, vol. 13, 1991, pp. 33–36.

Hesp et al., "Tetrahydropyranyl–and Furanyl–Protected . . . ", *J. Appl. Polym. Sci.*, vol. 42, pp. 877–883 1991.

English Abstract for Japanese Patent 224–89–52A, (Oct. 4, 1990).

English Abstract for Japanese Patent 3083063A (Apr. 9, 1991).

English Abstract for Japanese Patent 2025–850 A (Jan. 29, 1990).

English Abstract for Japanese Patent 2161–436 A (Jun. 21, 1990).

Greene, Theodora W "Protective Groups in Organic Synthesis" John Wiley & Sons, NY (1981) pp. 10, 11, 22, 23, 87.

March, Jerry "Advanced Organic Chemistry" Fourth Edition John Wiley & Sons, NY (1992) pp. 763–764.

*Primary Examiner*—Janis L. Dote
*Attorney, Agent, or Firm*—Keil & Weinkauf

[57] ABSTRACT

A radiation-sensitive mixture essentially consisting of
(a) a water-insoluble binder or binder mixture and
(b) a compound which forms a strong acid on exposure to radiation, component (a) being a phenolic resin in which some or all of the phenolic hydroxyl groups have been replaced with groups (IA) or (IB)

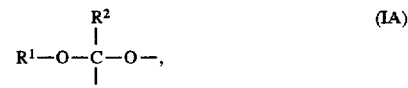

(IA)

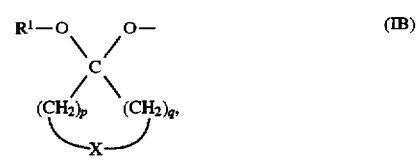

(IB)

where $R^1$, $R^2$ and $R^3$ are each alkyl or $R^1$ together with $R^2$ forms a ring and X is $CH_2$, O, S, $SO_2$ or $NR^4$, is suitable for the production of relief structures.

19 Claims, No Drawings

RADIATION-SENSITIVE MIXTURE

This application is a continuation of application Ser. No. 08/586,573, filed on Jan. 16, 1996, now abandoned, which is a continuation of Ser. No. 08/319,089 filed on Oct. 16, 1994, now abandoned, which is a continuation of Ser. No. 08/010,317 filed on Jan. 28, 1993, now abandoned.

The present invention relates to positive-working radiation-sensitive mixtures which contain a water-insoluble binder and a compound which forms an acid under the action of radiation, the binder containing certain groups which are hydrolyzed by acid catalysis, resulting in an increase in the alkali solubility of the mixture. These mixtures are sensitive to UV radiation, electron beams and X-rays and are particularly suitable as resist material.

Positive-working radiation-sensitive mixtures are known and in particular positive-working resist materials which contain o-quinonediazides in binders, for example novolaks or poly-p-hydroxystyrenes, which are soluble in aqueous alkaline media are used commercially. The sensitivity of these systems to radiation, in particular short-wavelength radiation, is however unsatisfactory in some cases.

Increases in the sensitivity of radiation-sensitive systems which produce, in the primary photo-reaction, a species which then initiates a catalytic secondary reaction independently of the radiation have been described. U.S. Pat. No. 3,915,706 describes, for example, photoinitiators which produce a strong acid which then cleaves acid-labile groups, such as polyaldehyde groups, in a secondary reaction.

Furthermore, radiation-sensitive mixtures based on acid-cleavable compounds are known, said mixtures containing, as the binder, a polymer which is soluble in aqueous alkaline media, and a compound which photo-chemically forms a strong acid and a further compound having acid-cleavable bonds, which increase the solubility in an alkaline developer as a result of the action of the acid (cf. DE-A 3 406 927). Examples of compounds which photochemically form a strong acid are diazonium, phosphonium, sulfonium, iodonium and halogen compounds. The use of these onium salts as photochemical acid donors in resist materials is also disclosed in, for example, U.S. Pat. No. 4,491,628. Crivello in Org. Coatings and Appl. Polym. Sci. 48 (1985), 65–69, gives a survey of the use of onium salts in resist materials.

Copolymers having phenolic and acid-labile groups, for example poly-(p-hydroxystyrene-co-tert-butoxycarbonyloxystyrene), are disclosed in J. Polym. Sci., Part A, Polym. Chem. Ed., 24 (1986), 2971–2980. However, if those copolymers of this group which are still alkali-soluble are used in conjunction with the commercial sulfonium salts, such as triphenylsulfonium hexafluoroarsenate, as also described in U.S. Pat. No. 4,491,628, these mixtures have the disadvantage that a very large amount of material is removed from the-unexposed parts, since the stated sulfonium salts do not sufficiently inhibit solubility.

DE-A 37 21 741 describes radiation-sensitive mixtures which contain a polymeric binder soluble in aqueous alkaline media and an organic compound whose solubility in an aqueous alkaline developer is increased by the action of an acid and which contains at least one acid-cleavable group, this organic compound producing a strong acid under the action of radiation.

DE-C 23 06 248 discloses a mixture of substances which become soluble as a result of exposure to light and a photosensitive recording material which contains a photoactive acid donor (halogen-containing s-triazine derivative or diazonium salt) and a reaction product of an organic compound, containing at least one alkyl vinyl ether group, with a monohydric or polyhydric phenol. A phenolic binder may also be present. Dihydropyran is explicitly claimed as the alkyl vinyl ether. However, these systems have too low a thermal stability and result in structural properties which make them unsuitable for the submicron range.

Poly-p-hydroxystyrene, some or all of whose OH groups have been reacted with dihydropyran to give tetrahydropyranyl ethers, is likewise disclosed as a component of photosensitive mixtures in JP 2248952, JP 03083063, JP 02025850, JP 02161436, EP 0 342 498, EP 0 388 813 and DE-A-4 007 924. The disadvantage of these systems is the danger of crosslinking on over-exposure or excessively high temperatures in the heating step after exposure (L. Schlegel, T. Ueno, H. Shiraishi, N. Hayashi and T. Iwayanagi, Microelectron. Eng. 13 (1991), 33). Furthermore, these systems require for development alkaline developers to which n-propanol has been added, this being a disadvantage with regard to disposal (S. A. M. Hesp, N. Hayashi and T. Ueno, J. Appl. Polym. Sci. 42 (1991), 877).

U.S. Pat. No. 4,101,323 describes radiation-sensitive copying materials which contain binders which have acid-cleavable —C—O—C groups in the main chain and a poly-chloro compound as an acid donor. EP-A 302 359 describes radiation-sensitive copying materials which contain a three component system comprising an alkali-soluble phenolic binder, a polychloro compound as acid donor and a compound having two acetal groups as an inhibitor. While the copying materials described in the above-mentioned U.S. Patent exhibit insufficient reproducibility in their preparation, the copying materials described in the EP-A suffer from the abovementioned disadvantages of the three-component systems.

It is an object of the present invention to provide novel positive-working highly active radiation-sensitive systems for the production of relief structures, which can be developed using aqueous alkaline solutions and permit the production of layers which are photosensitive in short-wavelength UV light.

For this purpose, a radiation-sensitive mixture which essentially contains a water-insoluble binder having an acid-labile group which is cleaved by the action of an acid and a compound forming a strong acid on exposure to radiation is to be exposed imagewise and heated, and the imagewise exposed parts of the layer are to be washed out with a developer.

We have found that this object is achieved and that, surprisingly, highly active radiation-sensitive systems which do not have the above disadvantages of the acetal groups, in particular the tendency to crosslink, and exhibit very good reproducibility and high resolution are obtained by replacing from 5 to 100% of the phenolic hydroxyl groups of a polymeric binder, such as a novolak or polyhydroxystyrene, with ketal groups.

The present invention relates to a radiation-sensitive mixture, essentially consisting of (a) a water-insoluble binder or binder mixture and (b) a compound which forms a strong acid on exposure to radiation, wherein component (a) is a phenolic resin in which from 5 to 100% of the phenolic hydroxyl groups have been replaced with groups of the general formula (IA)

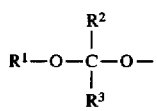

(IA)

where $R^1$, $R^2$ and $R^3$ are identical or different and are each straight-chain or branched alkyl of 1 to 16 carbon atoms, cycloalkyl of 5 to 16 carbon atoms or an oxaalkyl, thiaalkyl or azaalkyl radical having up to 8 oxygen, sulfur or nitrogen atoms and up to 16 carbon atoms, or $R^1$ and $R^2$ together form a carbocyclic radical via —$(CH_2)_n$— where n is from 3 to 6, or a heterocyclic radical via —$(CH_2)_m$—X—$(CH_2)_k$— where m is from 1 to 6, k is from 1 to 6, X is O, S, $SO_2$ or $NR^4$ and $R^4$ is alkyl, aryl, substituted aryl or aralkyl of up to 16 carbon atoms, or with groups of the general formula (IB)

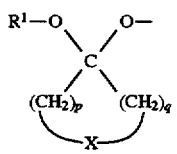

(IB)

where $R^1$ has the abovementioned meanings, p is from 1 to 6, q is from 1 to 6, X is $(CH_2)$, O, S, $SO_2$ or $NR^4$ and $R^4$ is alkyl, aryl, substituted aryl or aralkyl of up to 16 carbon atoms.

Novel radiation-sensitive mixtures in which poly-(p-hydroxystyrene) or poly-(p-hydroxy-a-methylstyrene) having average molecular weights $\overline{M}_n$ of from 200 to 200,000 are used as component (a), from 5 to 95, in particular from 10 to 80% of the phenolic hydroxyl groups being replaced by groups of the general formula (1A) and/or (1B), and radiation-sensitive mixtures in which component (a) contains groups (II) and (III), (II) and (IV), (II) and (V) or mixtures of these combinations

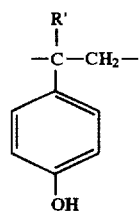

(II)

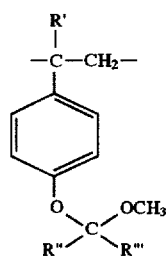

(III)

-continued

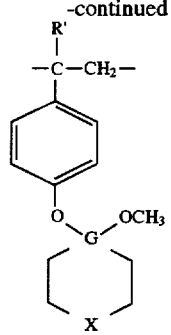

(IV)

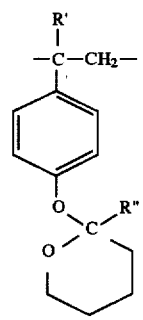

(V)

where R' is H or $CH_3$, R" and R'" are identical or different and are each alkyl of 1 to 16 carbon atoms, or an oxaalkyl, thiaalkyl or azaalkyl radical having up to 8 oxygen, sulfur or nitrogen atoms and up to 16 carbon atoms and X is O, S or $SO_2$, are preferred.

In preferred embodiments, the binder (a) in the novel radiation-sensitive mixture contains only structural units (II) and (III) in a ratio of from 1:10 to 10:1 or only structural units (II) and (IV) in a ratio of from 1:10 to 10:1 or only structural units (II) and (V) in a ratio of from 1:10 to 10:1.

A reaction product of poly-(p-hydroxystyrene) with 1-methyl-methylvinyl ether (=2-methoxy propene), a reaction product of poly-(p-hydroxystyrene) with 4-methoxy-5,6-dihydro-2H-pyran or a reaction product of poly-(p-hydroxystyrene) with 6-methyl-3,4-dihydro-2H-pyran is preferably used as the binder (1).

The novel radiation-sensitive mixtures preferably contain, as component (b), a sulfonium or iodonium salt of the general formula (VI) or (VII)

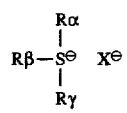

(VI)

or

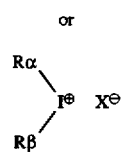

(VII)

where $R\alpha$, $R\beta$ and $R\gamma$ are identical or different and are each alkyl of 1 to 3 carbon atoms, aryl, substituted aryl or aralkyl and $X^{\ominus}$ is $ClO_4^{\ominus}$, $AsF_6^{\ominus}$, $SbF_6^{\ominus}$, $PF_6^{\ominus}$, $BF_4^{\ominus}$ and/or $CF_3SO_3^{\ominus}$, in particular those in which at least one of the radicals $R\alpha$, $R\beta$ and $R\gamma$ is a radical of the general formula (VIII)

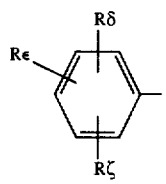
(VIII)

where Rζ, Rε and Rδ are identical or different and are each H, OH, halogen, alkyl or alkoxy, each of 1 to 4 carbon atoms.

It is also possible to use, as organic compound (b), sulfonium salts of the general formula (IX)

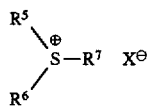
(IX)

where $R^5$, $R^6$ and $R^7$ are identical or different and are each aliphatic and/or aromatic radicals which may contain hetero atoms, or two of the radicals $R^5$ to $R^7$ are bonded to one another to form a ring, with the proviso that at least one of the radicals $R^5$ to $R^7$ contains at least one group which can be cleaved by an acid, and one of the radicals $R^5$ to $R^7$ may be bonded to one or more further sulfonium salt radicals, if necessary via acid-cleavable groups, and $X^{\ominus}$ is a nonnucleophilic counter-ion.

The novel radiation-sensitive mixtures may furthermore contain, as component (b), a sulfonic ester, an alkylsulfonic ester of a compound having at least two phenolic hydroxyl groups or a disulfone.

In the novel radiation-sensitive mixture, component (a) may be present in an amount of from 80 to 99% by weight, and component (b) in an amount of from 1 to 20% by weight.

The novel radiation-sensitive mixture may additionally contain a sensitizer which absorbs radiation and transfers it to component (b), and in addition up to 1% by weight of an adhesion promoter, surfactant or dyes.

The present invention furthermore relates to a process for the preparation of photosensitive coating materials, wherein the novel radiation-sensitive mixture is used, and to a process for the production of relief structures by application of a radiation-sensitive mixture in a layer thickness of from 0.1 to 5 μm to a conventionally pretreated substrate, drying at from 70 to 130° C., imagewise exposure, if necessary heating to 140–160° C. and development with an aqueous alkaline solution, wherein the novel radiation-sensitive mixture is used.

Regarding the components of the novel radiation-sensitive mixture, the following may be stated specifically.

a) Owing to the generally required plasma etching stability, suitable water-insoluble binders or binder mixtures are phenolic resins in which from 5 to 100, in particular from 10 to 80% of phenolic hydroxyl groups have been replaced with the groups (IA) and/or (IB), for example corresponding novolaks having molecular weights $\overline{M}_n$ of from 300 to 20,000, preferably from 300 to 2,000, g/mol, and, for exposure in a short-wavelength UV range (≦300 nm), in particular novolaks based on p-cresol/formaldehyde, poly(p-hydroxystyrenes) and poly(p-hydroxy-α-methylstyrenes) or copolymers of p-hydroxystyrene or p-hydroxy-α-methylstyrene, where these poly(p-hydroxy-styrenes) generally have molecular weights $\overline{M}_n$ of from 200 to 200,000, preferably from 1,000 to 40,000, g/mol. These poly(p-hydroxystyrenes) may also be modified according to the invention in a known manner by (polymer analogous) reaction of the hydroxyl groups with, for example, 4-methoxy-5,6-dihydro-2H-pyran, 1-methyl-methyl-vinyl ether or 6-methyl-3,4-dihydro-2H-pyran. The modified polymeric binders (a) which are thus obtainable and in the present case also understood as being copolymers are preferably those which consist essentially of groups (II) together with (III), (IV) and/or (V)

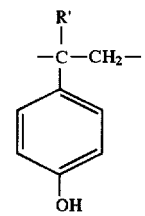
(II)

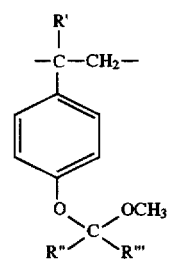
(III)

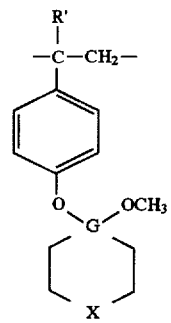
(IV)

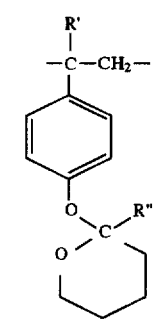
(V)

where R' is H or $CH_3$, R" and R'" are identical or different and are each alkyl of 1 to 16, preferably 1 to 8, carbon atoms, for example methyl, ethyl, n-propyl, isopropyl, n-butyl, isobutyl, tert-butyl, pentyl, hexyl, heptyl, octyl, 2-ethylhexyl or cyclopentyl, cyclohexyl, oxaalkyl, thiaalkyl or azaalkyl radicals having up to 8 oxygen, sulfur or nitrogen atoms and up to 16 carbon atoms, for example 2-methoxyethyl, 2-methoxypropyl or $-[CH_2-CH_2-O]_rH$ in which r is from 2 to 4, and X is O, S or $SO_2$, are preferred.

The polymers to be used according to the invention can be prepared by acid-catalyzed, polymer-analogous reaction of the corresponding novolaks of polyhydroxy-styrenes, similarly to the known method conventionally used for low molecular weight substances (cf. for example T. W. Greene, Protective Groups in Organic Synthesis, John Wiley & Sons, N.Y. 1981), with the corresponding vinyl compounds.

Particularly preferred starting materials are:

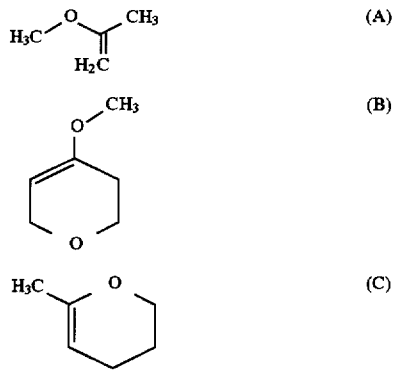

For example, the partial reaction of polyhydroxy-styrene with (A) gives a group of the general formula (III), reaction with (B) results in a group of the general formula (IV) and the reaction of (C) gives a member of the general formula (V).

The degree of the reaction can be determined by NMR spectroscopy.

Mixtures of the above-mentioned binders (a) are also suitable. Binder (a) is present in the novel mixture in general in amounts of from 80 to 99, preferably from 90 to 97% by weight, based on the total amount of the radiation-sensitive mixture (a)+(b).

b) Suitable compounds (b) which form a strong acid on exposure to radiation are in principle all compounds which have this property and are thus effective as acid donors. However, iodonium and in particular sulfonium salts are preferred for exposure to short-wavelength UV light. These are of the general formulae (VI) and (VII)

where $R\alpha$, $R\beta$ and $R\gamma$ are identical or different and are each alkyl, for example of 1 to 5 carbon atoms, preferably methyl or ethyl, aryl, such as phenyl, or aralkyl, such as benzyl, or a radical

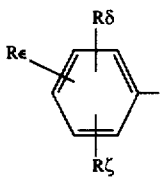

where $R\zeta$, $R\epsilon$ and $R\delta$ are identical or different and are each hydrogen, OH, halogen, eg. chlorine or bromine, alkyl, for example of 1 to 4 carbon atoms, preferably methyl or tert-butyl, or alkoxy, for example of 1 to 4 carbon atoms, preferably methoxy or tert-butoxy, and $X^\ominus$ is $AsF_6^\ominus$, $SbF_6^\ominus$, $PF_6^\ominus$, $BF_4^\ominus$, $ClO_4^\ominus$ or $CF_3SO_3^\ominus$.

Examples of suitable components (b) are triphenylsulfonium salts and diphenyliodonium salts, tris(4-hydroxyphenyl) sulfonium salts and tris(4-ethoxycarbonyloxyphenyl) sulfonium salts where in each case the counterion $X^\ominus$ is $ClO_4^\ominus$, $AsF_6^\ominus$, $PF_6^\ominus$, $SbF_6^\ominus$, $BF_4^\ominus$ and/or $CF_3SO_3^\ominus$.

Other particularly preferred components (b) are alkylsulfonates of compounds which contain at least two phenolic OH groups. Examples of particularly suitable substances are 1,2,3-tris(methanesulfonyloxy)benzene and 1,3-bis-(methanesulfonyloxy)-benzene.

Mixtures of the compounds stated under (b) may also be used. Component (b) is present in the novel radiation-sensitive mixture in general in amounts of from 1 to 20, preferably from 2 to 10% by weight, based on the total amount of the radiation-sensitive mixture (a)+(b).

The novel radiation-sensitive mixture may additionally contain further conventional assistants and additives.

The novel mixtures are preferably dissolved in an organic solvent, the solids content being in general from 5 to 40% by weight. Preferred solvents are aliphatic ketones, ethers and esters, as well as mixtures thereof. Alkylene glycol monoalkyl ethers, for example ethyl-cellosolve, butylglycol, methylcellosolve and 1-methoxy-2-propanol, alkylene glycol alkyl ether esters, for example methylcellosolve acetate, ethylcellosolve acetate, methyl propylene glycol acetate and ethyl propylene glycol acetate, ketones, for example cyclohexanone, cyclopentanone and methyl ethyl ketone, and acetates, such as butyl acetate, and aromatics, such as toluene and xylene, are particularly preferred. The choice of the corresponding solvents and of mixtures thereof depends on the choice of the particular phenolic polymer or novolak and of the photosensitive component.

Other additives, such as adhesion promoters, wetting agents, dyes and plasticizers, may also be added, in general in amounts of up to 1% by weight.

The novel radiation-sensitive mixtures are sensitive to X-rays, electron beams and UV radiation. If necessary, small amounts of sensitizers, such as pyrene and perylene, may be added in order to sensitize the compounds in relatively long-wavelength UV to the visible wavelength range. For exposure in specific wavelength ranges, for example to short-wavelength UV ($\leq$300 nm), high transparency of the layers at the particular exposure wavelength is required. In conventional exposure apparatuses based on mercury lamps, the 254 nm line is used, or excimer lasers which emit at 248 nm (KrF) are employed. Radiation-sensitive recording materials should therefore have very low optical densities in this range. The novel polymeric binders based on novolaks have proved to be not very suitable for these applications, so that the polymeric binders based on hydroxystyrenes are preferably used for these special applications.

In the novel process for the production of positive relief patterns, a radiation-sensitive recording layer which essentially consists of the novel radiation-sensitive mixture is exposed imagewise to a dose such that the solubility of the exposed parts in aqueous alkaline solvents after a thermal heating step at from 40 to 160° C. increases and these parts can be selectively removed with the alkaline developer.

The photoresist solutions containing the novel radiation-sensitive mixture are generally applied in layer thicknesses of from 0.1 to 5 µm, preferably from 0.5 to 1.5 µm, to suitable substrates, for example surface-oxidized silicon wafers, by spin coating and are dried (for example at from 70 to 130° C.) and exposed imagewise to a suitable light source through a photomask, for example to short-wavelength UV radiation (deep UV) in wavelengths of from 200 to 300 nm. Particularly suitable light sources are KrF excimer lasers (248 nm). After the imagewise exposure, and if necessary after brief heating (postbake) up to 160° C., development is effected with conventional aqueous alkaline developers, in general at a pH of from 12 to 14, the exposed parts being washed out. The resolution is in the submicron range. The exposure energy required for the novel radiation-sensitive mixtures is in general from 10 to 300 mJ/cm² for layer thicknesses of 1 µm.

The novel radiation-sensitive mixtures exhibit high sensitivity, good resolution and easy processability and are therefore particularly advantageous for litho-graphy in the short-wavelength range.

Compared with the known, acetal-containing systems, in particular those containing tetrahydropyranyl ethers, these systems have the advantage of a wide working range without giving rise to the danger of cross-linking, regardless of the type of acid donor and/or of the temperature of the heating step. Another considerable advantage is the fact that aqueous alkaline solutions may be used as developers, without the addition of an organic solvent.

In the Examples which follow, parts and percentages are by weight, unless stated otherwise.

EXAMPLE 1

A resist solution is prepared from 95 parts of poly-p-hydroxystyrene in which 32% of the phenolic OH groups are protected as 4-methoxytetrahydropyran ether, 5 parts of triphenylsulfonium triflate and 300 parts of propylene glycol monomethyl ether acetate. The solution is then filtered through a filter having a pore diameter of 0.2 µm.

The resist solution is applied by spin coating to a silicone wafer which has been coated with hexamethyl-disilazane as an adhesion promoter, a layer thickness of about 1 µm being obtained. Thereafter, the wafer is dried for 1 min at 90° C. on a hotplate and is then exposed to an excimer laser at 248 nm. The wafer is then heated for 1 min at 90° C. and is developed in an aqueous solution of tetra-N-methylammonium hydroxide at pH 12–13.6.

The photosensitivity is 11 mJ/cm².

EXAMPLE 2

A photoresist solution is prepared as described in Example 1. In this case, however, 4-hydroxyphenyl-dimethylsulfonium triflate is used as the acid donor and ethyl lactate as the solvent. The heating step after exposure is carried out here at 120° C.

The photosensitivity is 9 mJ/cm², and there are no detectable signs of crosslinking even in the strongly exposed parts.

EXAMPLE 3

A photoresist solution is prepared as described in Example 1. In this case, however, 1,2,3-tris(methanesulfonyloxy) benzene is used as the acid donor.

The photosensitivity is 49 mJ/cm².

EXAMPLE 4

A photoresist solution is prepared as described in Example 1. In this case, however, phenyl 4-anisyl disulfone is used as the acid donor.

The photosensitivity is 10 mJ/cm².

COMPARATIVE EXAMPLE 1

A resist solution is prepared from 95 parts of poly(p-hydroxystyrene) in which 36% of the phenolic OH groups have been protected as tetrahydropyran ether, 5 parts of 4-hydroxyphenyldimethylsulfonium triflate and 250 parts of ethyl lactate.

After processing as in Example 2, the strongly exposed parts (>200 mJ/cm²) are found to contain insoluble material which is due to crosslinking.

We claim:

1. A radiation-sensitive mixture, consisting essentially of
   (a) a water-insoluble binder or binder mixture and
   (b) a compound which forms a strong acid on exposure to radiation, wherein component (a) is a phenolic resin in which from 5 to 100% of the phenolic hydroxyl groups have been replaced with a group of the general formula (IB)

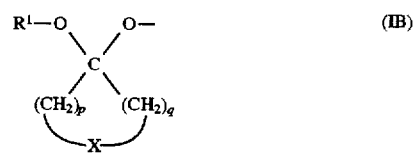

where R¹ is a straight-chain or branched alkyl of 1 to 16 carbon atoms, a cycloalkyl of 5 to 16 carbon atoms or an oxaalkyl, thiaalkyl or azaalkyl radical having up to 8 oxygen, sulfur or nitrogen atoms and up to 16 carbon atoms, p is from 1 to 6, q is from 1 to 6, X is O.

2. A radiation-sensitive mixture as claimed in claim 1, wherein component (a) contains groups (II) and (IV)

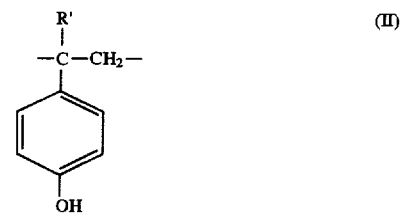

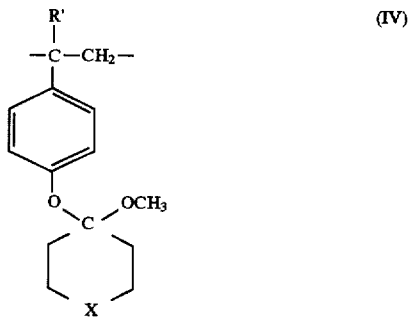

where R', is H or CH₃, and X is O.

3. A radiation-sensitive mixture as defined in claim 2, wherein a binder (a) contains only groups (II) and (IV) in a ratio of from 1:10 to 10:1.

4. A radiation-sensitive mixture as defined in claim 2, wherein a reaction product of poly(p-hydroxystyrene) with 4-methyl-5,6-dihydro-2H-pyran is used as binder (a).

5. A radiation-sensitive mixture as claimed in claim 1, wherein poly(p-hydroxystyrene) or poly(p-hydroxy-α-methylstyrene) having average molecular weights $\overline{M}_n$, of from 200 to 200,000 is used as component (a), from 10 to 80% of the phenolic hydroxyl groups having been replaced with groups of the formula (IB).

6. A radiation-sensitive mixture as defined in claim 1, wherein a sulfonium or iodonium salt of the formula (VI) OR (VII)

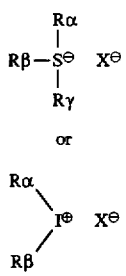

where Rα, Rβ and Rγ are identical or different and are each alkyl of 1 to 3 carbon atoms, aryl, substituted aryl or aralkyl and $X^\ominus$ is $ClO_4^\ominus$, $AsF_6^\ominus$, $SbF_6^\ominus$, $PF_6^\ominus$, $BF_4^\ominus$ or $CF_3SO_3^\ominus$, is used as component (b).

7. A radiation-sensitive mixture as claimed in claim 6, wherein at least one of the radicals Rα, Rβ and Rγ is a radical of the formula (VIII)

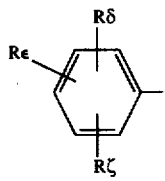

where Rδ, Rε and Rζ are identical or different and are each H, OH, halogen, alkyl of 1 to 4 carbon atoms or alkoxy of 1 to 4 carbon atoms.

8. A radiation-sensitive mixture as claimed in claim 1, wherein a sulfonium salt of the formula (IX)

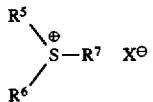

where $R^5$, $R^6$ and $R^7$ are identical or different and are each an aliphatic or aromatic radical which may contain hetero atoms, or two of the radicals $R^5$ to $R^7$ are bonded to one another to form a ring, with the proviso that at least one of the radicals $R^5$ to $R^7$ contains at least one acid-cleavable group, and $X^\ominus$ is a nonnucleophilic counter-ion, is used as organic compound (b).

9. A radiation-sensitive mixture as defined in claim 1, wherein a sulfonic ester is component (b).

10. A radiation-sensitive mixture as defined in claim 1, wherein an alkylsulfonic ester of a compound having at least two phenolic hydroxyl groups is component (b).

11. A radiation-sensitive mixture as defined in claim 1, wherein a disulfone is contained as component (b).

12. A radiation-sensitive mixture as defined in claim 1, wherein component (a) is present in an amount of from 80 to 99% by weight based on the total amount of radiation mixture (a)+(b) and component (b) in an amount of from 1 to 20% by weight based on the total amount of the radiation-sensitive mixture (a)+(b).

13. A radiation-sensitive mixture as defined in claim 2, which additionally contains a sensitizer which absorbs radiation and transfers it to component (b).

14. A radiation-sensitive mixture as defined in claim 1, which additionally contains up to 1% by weight based the total amount of (a)+(b)+additive of an adhesion promoter, a surfactant or dyes.

15. A photosensitive recording element comprising a layer of a radiation sensitive mixture as defined in claim 1 overlying a substrate.

16. A radiation-sensitive mixture as claimed in claim 1, wherein the phenolic resin of component (a) is poly(p-hydroxystyrene) or poly(p-hydroxy-α-methylstyrene) in which from 5 to 100% of the phenolic hydroxyl groups have been replaced with a group of formula (IB).

17. A radiation-sensitive mixture as claimed in claim 16, wherein from 10 to 80% of the phenolic hydroxyl groups have been replaced with a group of formula (IB).

18. A process for the production of relief structures by application of a radiation-sensitive mixture as defined in claim 1 in a layer thickness of from 0.1 to 5 μm to a substrate, drying the mixture on the substrate at a temperature of from 70° to 130° C. imagewise exposing the dried layer, and development of the imagewise exposed layer with an aqueous alkaline solution.

19. The process of claim 18 wherein subsequent to the imagewise exposing step, the imagewise exposed layer is heated from 40° to 160° C.

* * * * *